(12) United States Patent
Bu et al.

(10) Patent No.: US 7,700,467 B2
(45) Date of Patent: Apr. 20, 2010

(54) METHODOLOGY OF IMPLEMENTING ULTRA HIGH TEMPERATURE (UHT) ANNEAL IN FABRICATING DEVICES THAT CONTAIN SIGE

(75) Inventors: Haowen Bu, Plano, TX (US); Scott Gregory Bushman, Richardson, TX (US); Periannan Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/872,333

(22) Filed: Oct. 15, 2007

(65) Prior Publication Data

US 2009/0098665 A1    Apr. 16, 2009

(51) Int. Cl.
*H01L 21/265* (2006.01)
(52) U.S. Cl. ............... 438/518; 438/505; 438/415; 438/428; 438/715; 438/303; 438/522; 438/14; 257/E21.054; 257/E21.12; 257/E21.334; 257/E21.409; 257/E21.53
(58) Field of Classification Search .......... 257/E21.054, 257/E21.12, E21.53, E21.039; 438/8, 9, 438/16
See application file for complete search history.

(56) References Cited

U.S. PATENT DOCUMENTS

| | | | | |
|---|---|---|---|---|
| 5,994,676 | A * | 11/1999 | Dutartre | ............ 219/497 |
| 6,599,760 | B2 * | 7/2003 | Watanabe | ............ 438/5 |
| 7,335,611 | B2 * | 2/2008 | Ramaswamy et al. | ....... 438/795 |
| 7,465,634 | B2 * | 12/2008 | Lim et al. | ............ 438/300 |
| 2005/0051798 | A1 * | 3/2005 | Lanzerotti et al. | ........... 257/197 |
| 2005/0233534 | A1 * | 10/2005 | Lanzerotti et al. | ........... 438/309 |
| 2005/0255610 | A1 * | 11/2005 | Sato et al. | ............ 438/14 |
| 2005/0263760 | A1 * | 12/2005 | Langer et al. | ............ 257/48 |
| 2007/0190242 | A1 * | 8/2007 | Tomiyama et al. | ........... 427/152 |
| 2008/0206965 | A1 * | 8/2008 | Gluschenkov et al. | ...... 438/478 |
| 2008/0242032 | A1 * | 10/2008 | Chakravarthi et al. | ........ 438/285 |

* cited by examiner

*Primary Examiner*—Fernando L Toledo
*Assistant Examiner*—Ankush k Singal
(74) *Attorney, Agent, or Firm*—Warren L. Franz; Wade J. Brady, III; Frederick J. Telecky, Jr.

(57) ABSTRACT

Exemplary embodiments provide methods for implementing an ultra-high temperature (UHT) anneal on silicon germanium (SiGe) semiconductor materials by co-implanting carbon into the SiGe material prior to the UHT anneal. Specifically, the carbon implantation can be employed to increase the melting point of the SiGe material such that an ultra high temperature can be used for the subsequent anneal process. Wafer warpage can then be reduced during the UHT anneal process and potential lithographic mis-alignment for subsequent processes can be reduced. Exemplary embodiments further provide an inline control method, wherein the wafer warpage can be measured to determine the litho-mis-alignment and thus to control the fabrication process. In various embodiments, the disclosed methods can be employed for the fabrication of source/drain extension regions and/or source/drain regions of transistor devices, and/or for the fabrication of base regions of bipolar transistors.

22 Claims, 5 Drawing Sheets

METHODOLOGY OF IMPLEMENTING ULTRA HIGH TEMPERATURE (UHT) ANNEAL IN FABRICATING DEVICES THAT CONTAIN SIGE

FIELD OF THE INVENTION

This invention generally relates to semiconductor fabrication and, more particularly, to ultra-high temperature (UHT) anneal of semiconductor materials.

BACKGROUND OF THE INVENTION

Silicon-germanium (SiGe) has been proven to be an effective material to improve performance of transistor devices. For example, SiGe material can be used for source and drain (S/D) regions of a PMOS device to improve device carrier mobility by exerting compressive stress in the channel region.

Ultra-high temperature (UHT) millisecond anneal has also been applied to transistor devices with a view to maximizing electrical activation by increasing dopant solid solubility in semiconductor materials. For example, an UHT anneal can be performed to activate doped source/drain regions at a high temperature of more than 1150° C., while a conventional thermal anneal typically has a low peak temperature limited under 1100° C.

Problems arise, however, due to the low melting point of the SiGe material. For example, the melting point of a SiGe material that contains 20% Ge can be approximately 1275° C., which is lower than the melting point of the traditional material silicon as about 1414° C. In addition, the higher the Ge concentration, the lower the melting point of the SiGe material. Depending on the annealing temperature used, the SiGe material with low melting point may therefore be melted during the UHT anneal and subsequently re-crystallized while cooling down. This re-crystallization of the SiGe material can cause wafer warpage that generates permanent damage to the entire device in subsequent processes. For example, because of wafer warpage, lithographic pattern misalignment can be incurred during the subsequent contact patterning and/or dielectric patterning steps.

Thus, there is a need to overcome these and other problems of the prior art and to provide methods for implementing UHT anneal on SiGe semiconductor materials.

SUMMARY OF THE INVENTION

According to various embodiments, the present teachings include a method for processing a semiconductor material. In this method, a SiGe material that requires an ultra-high temperature (UHT) anneal can be included in a semiconductor structure. By implanting carbon into the SiGe material, the melting point of the SiGe material can be increased. Such carbon implanted SiGe material can then be annealed at an ultra-high temperature ranging from about 1235° C. to about 1300° C. for about 1.0 millisecond or shorter.

According to various embodiments, the present teachings also include a method for controlling a semiconductor process. The semiconductor process can be initiated with a semiconductor structure that has a SiGe material. To provide an increased melting point, the SiGe material can be implanted with carbon and followed by a first curvature inspection of the resulting semiconductor structure. The resulting semiconductor structure can be annealed at an ultra-high temperature of about 1235° C. to about 1300° C. for about 1.0 millisecond or shorter. A second curvature inspection can thereafter be performed to the annealed semiconductor structure. Based on the difference between the first curvature inspection and the second curvature inspection, a litho-misalignment of the semiconductor structure can be determined.

According to various embodiments, the present teachings further include a method for forming a transistor device. The transistor device can be formed by first forming a gate stack over a semiconductor body, and forming a sidewall spacer along each lateral sidewall of the gate stack, followed by a formation of source and drain recesses. The source and drain recesses can be formed by an isotropic etch in the semiconductor body, wherein the source/drain recesses can reside in source/drain regions of the semiconductor body, and extend laterally toward the channel region underneath the gate stack. In the source/drain recesses, a p-doped SiGe material can be epitaxially grown and be implanted with carbon to provide an increased melting point. The resulting carbon implanted SiGe material can be annealed at an ultra-high temperature ranging from about 1235° C. to about 1300° C. for about 1.0 ms or shorter.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide methods for implementing an ultra-high temperature (UHT) anneal on silicon germanium (SiGe) semiconductor materials by co-implanting carbon into the SiGe material prior to the UHT anneal. Specifically, the carbon implantation can be employed to increase the melting point of the SiGe material such that an ultra high temperature can be used for the subsequent anneal process. Wafer warpage can then be reduced during the UHT anneal process and lithographic misalignment (litho-misalignment) for subsequent processes can be reduced. Exemplary embodiments further provide an inline control method, wherein the wafer warpage can be measured to determine the litho-misalignment and thus to control the fabrication process. In various embodiments, the disclosed methods can be employed, for example, for the fabrication of source/drain extension regions and/or source/drain regions of transistor devices, and/or for the fabrication of base regions of bipolar transistors.

Figure 1:
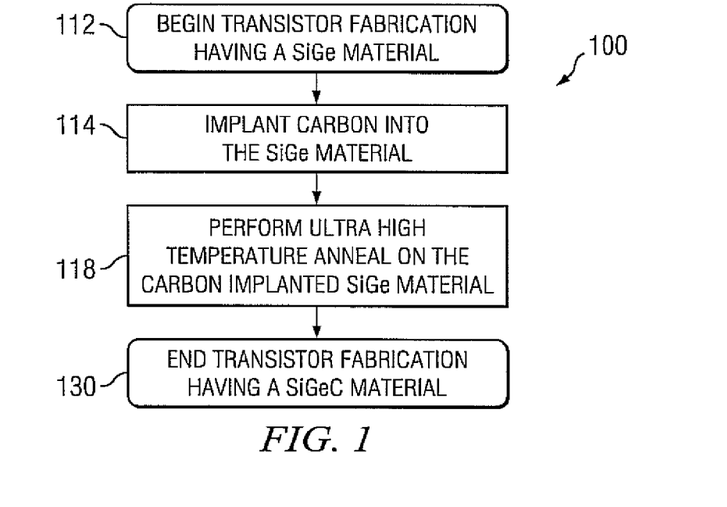
FIG. 1 depicts an exemplary method for implementing an UHT anneal on SiGe material in accordance with the present teachings.

FIG. 1 depicts an exemplary method 100 for implementing an UHT anneal on SiGe material in accordance with the present teachings. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings. Furthermore, the methods according to the present teachings may be implemented in association with the fabrication of ICs and composite transistors illustrated and described herein, as well as in association with other transistors and structures not illustrated, including but not limited to NMOS and/or PMOS composite transistors.

Beginning at 112 of the method 100, transistor fabrication can be initiated and the transistor device can include a silicon germanium (SiGe) material that requires a subsequent ultra-high temperature (UHT) anneal according to manufacture requirements. In one example, the SiGe material can be used in base regions for complementary bipolar transistors. In another example, the SiGe material can be a stress inducing material used in transistor devices to improve carrier mobility in their channel regions. For example, the SiGe material can be a compressive stress inducing material used in source/drain (S/D) extension regions and/or source/drain (S/D) regions for PMOS devices.

In an exemplary embodiment, the SiGe material can be formed via a selective epitaxial (epi) deposition, such as a LPCVD (low pressure chemical vapor deposition) process using dichlorosilane, germane and hydrogen chloride as source gases. In addition, the SiGe material can be doped in-situ during the selective epi deposition by incorporating, for example, a p-type dopant reactant in the exemplary CVD process. For example, diborane or other type reactants can be employed in-situ, wherein a boron doped SiGe material can be formed in desired regions of transistor devices. Alternatively, if the desired regions (e.g., source/drain regions) are not doped during the selective epi deposition, a source/drain implantation can be performed after such deposition.

At 114, the SiGe material can be further implanted with carbon. The carbon implantation can be performed by implanting a carbon-containing species at energies of, for example, about 4 KeV to about 15 KeV, and doses of, for example, about $5 \times 10^{14}$ atoms/cm$^2$ to about $2 \times 10^{15}$ atoms/cm$^2$. Such implant energies can be chosen in a manner that the carbon implant projected range is greater than the depth of the deposited SiGe layer. The carbon doses generally can not exceed the upper dosage range (i.e., about $2 \times 10^{15}$ atoms/cm$^2$), because SiGe stress relaxation occurs when carbon dose is too high. In an exemplary embodiment, the carbon implantation can be performed at an energy of about 10 KeV and a dose of about $1 \times 10^{15}$ cm$^{-2}$ in a high current implant tool. In various embodiments, carbon can be implanted into a doped SiGe material. Alternatively, carbon can be incorporated in-situ during the formation of the SiGe material, with an addition of a carbon containing gas such as methylsilane.

At 118, an UHT anneal can be performed to activate the dopant on the carbon implanted SiGe material (e.g., source/drain regions or source/drain extension regions of a PMOS device or base regions of a bipolar transistor device). For example, the carbon implanted SiGe material can be annealed at a temperature of about 1235° C. to about 1300° C. and having a dwell time of, for example, about 1.0 millisecond or shorter.

The annealed carbon implanted SiGe material can result in a $Si_yGe_{1-x-y}C_x$ (also read as SiGeC) material, where x is about 0.5% to about 1.0%. While not intending to be bound by any particular theory, it is believed that the carbon doping/implantation can increase the melting point of the SiGe material by, for example, about 50° C. or higher, wherein a SiGe material (i.e., no carbon implanted) can have a melting point of about 1250° C. or higher depending on the concentration of Ge in the SiGe material. Consequently, the resulting SiGeC material can have an increased melting point of about 1300° C. or higher and a subsequent ultra-high temperature anneal can be performed to activate the dopant using a temperature as high as 1270° C. or more.

Due to the increased melting point, the resulting SiGeC material used in transistor devices can reduce the wafer warpage generated during the UHT anneal process. For example, implantation of carbon can reduce the wafer warpage by a factor of about 6 or higher. Referring back to FIG. 1, the method 100 concludes at 130 wherein the transistor device can include a SiGeC material.

Figure 2:
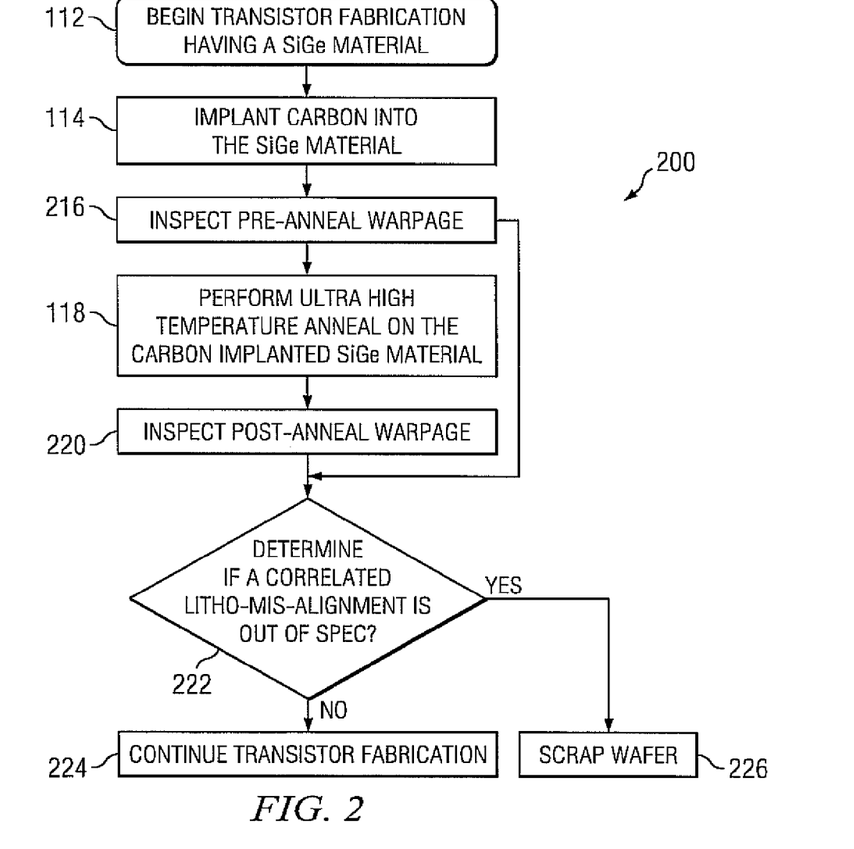
FIG. 2 depicts an exemplary inline control method for implementing the UHT anneal on the SiGe material as shown in FIG. 1 in accordance with the present teachings.

FIG. 2 depicts an exemplary inline control method 200 for implementing UHT anneal on the SiGe material as described in FIG. 1 in accordance with the present teachings. One or more aspects of the method 200 can therefore be similar to the method 100 of FIG. 1. For example, acts 112, 114, and/or 118 can proceed generally in the same manner as the method 100.

Beginning at 112 of the method 200 in FIG. 2, transistor fabrication can be initiated using a SiGe material that requires a subsequent ultra-high temperature (UHT) anneal. At 114 in FIG. 2, the SiGe material can be co-implanted with carbon as similarly described in FIG. 1.

At 216 in FIG. 2, following the carbon implantation of the SiGe material and prior to the subsequent UHT process (e.g., as shown at 118 in FIG. 1), the processed device can be inspected using a wafer curvature measurement. The curvature measurement can measure the radius of curvature of a curved surface (e.g., a wafer) as known to one of ordinary skill in the art.

At 118 in FIG. 2, an UHT anneal process can be performed to activate the dopant on the carbon co-implanted SiGe material as similarly described in FIG. 1.

At 220 in FIG. 2, following the UHT anneal process, a second curvature inspection of the annealed device can be performed by a suitable wafer curvature measurement. Wafer warpage can then be calculated from the difference of the wafer curvature inspections, i.e., the first curvature inspection performed pre-anneal at 216 and the second curvature inspection performed post-anneal at 220, in various directions (e.g., in an x-direction or in a y-direction) of the processed wafer.

Figure 3A:
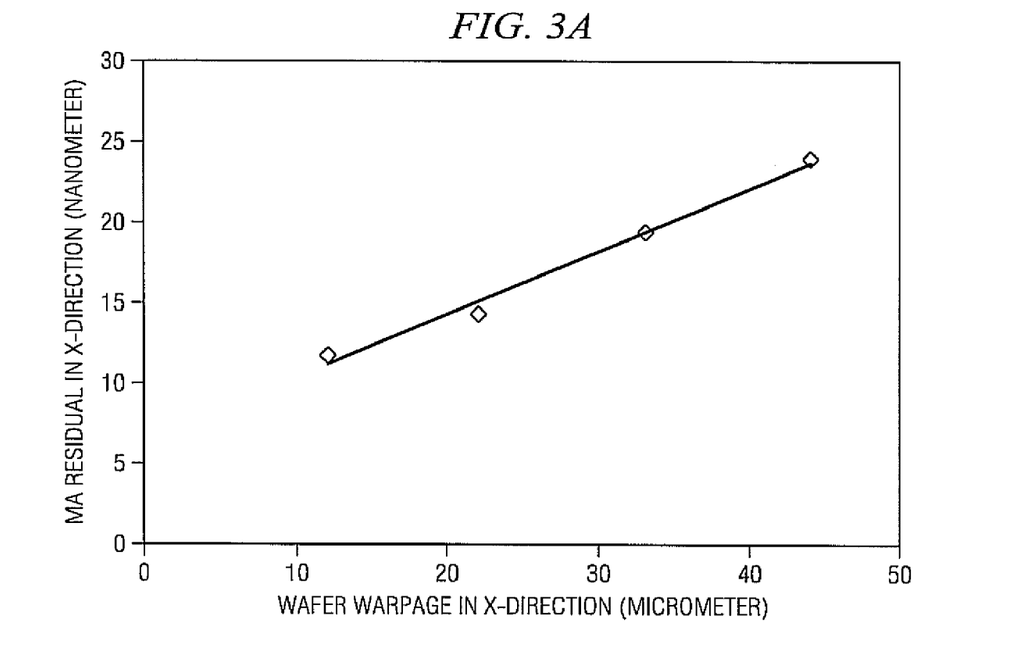
FIGS. 3A-3B depict an exemplary correlation of litho-misalignment (MA) residual with wafer warpage in accordance with the present teachings.
Figure 3B:
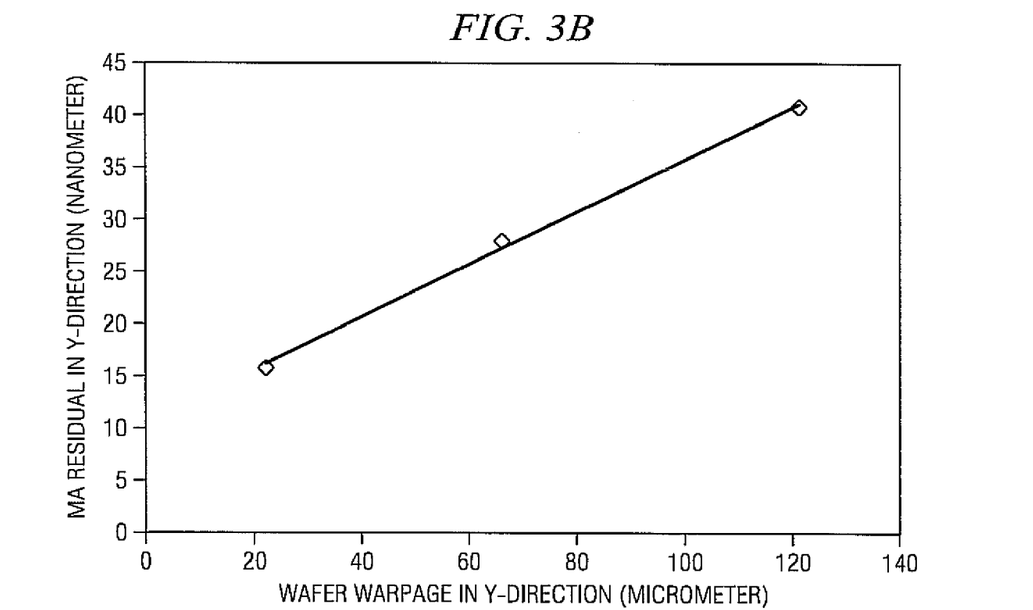

Generally, the wafer warpage can cause lithographic pattern misalignment (also referred to herein as "overlay degradation") later in the back-end-of-line flow, for example, during the formation of contact pattern and/or dielectric pattern of transistor devices. FIGS. 3A-3B depict exemplary results for the litho-misalignment (MA) residual and the corresponding wafer warpage plotted in the form of an x-y graph in accordance with the present teachings. Specifically, FIG. 3A shows a correlation of litho-misalignment (MA) residual with wafer warpage in an x-direction of the exemplary processed wafer, while FIG. 3B shows a correlation in a y-direction of the processed wafer. As shown in both FIG. 3A and FIG. 3B, a line shape approximation of the exemplary data points can be obtained to correlate the litho-misalignment (MA) residual with the corresponding wafer warpage in both the x-direction (see FIG. 3A) and the y-direction (see FIG. 3B). In addition, as shown in FIGS. 3A-3B, a small wafer warpage can result in a reduced and desired litho-misalignment for the back-end-of-line process.

Referring back to FIG. 2, at 222, the litho-mis-alignment can thus be determined based on the correlation (e.g., as that shown in FIGS. 3A-3B) between the measured wafer warpage and the litho-mis-alignment residual. If the correlated litho-mis-alignment residual is within (i.e., lower than) the manufacturing specification, the fabrication process can be continued at 224 according to the manufacture requirements. On the other hand, if the determined litho-mis-alignment residual is out of (i.e., higher than) the manufacturing specification, the fabrication process can be ceased and the processed wafer can be scrapped at 226. In this manner, the inline control method 200 can be employed to timely detect potential manufacturing problems and to effectively prevent large scale material from scrapping later in the process flow.

Figure 4:
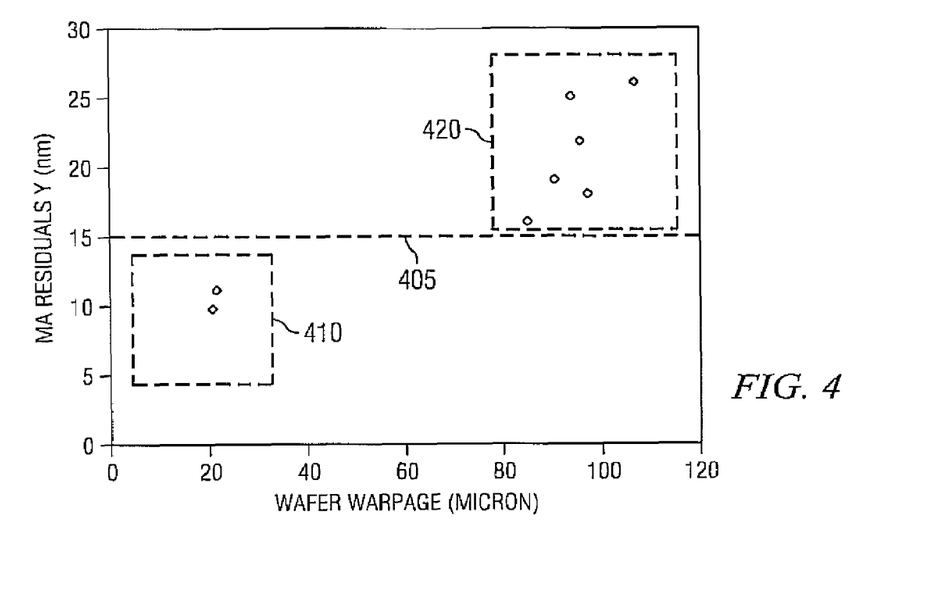
FIG. 4 depicts an exemplary result showing the effect of carbon implantation on the litho-misalignment residual and its comparison with the required manufacturing specification in accordance with the present teachings.

FIG. 4 depicts an exemplary result showing the effect of the carbon implantation on the litho-mis-alignment residual and its comparison with the required manufacturing specification (spec) in accordance with the present teachings. Specifically, FIG. 4 includes a spec curve 405 showing a required litho-mis-alignment specification, for example, about 15 nm. FIG. 4 also includes data-point groups 410 and 420 for structures/devices having an annealed SiGeC material (i.e., with carbon co-implanted) and an annealed SiGe material (i.e., with no carbon implanted), respectively. As shown, devices having the annealed SiGeC material (see data points in 410) can provide lower and desired litho-mis-alignment residuals as compared with the required mis-alignment spec (i.e., about 15 nm, see spec curve 405), while devices having the annealed SiGe material (see data points in 420) can provide litho-mis-alignment residuals that can be higher than and out of the manufacturing spec (see spec curve 405). Therefore, the disclosed SiGeC material (i.e., the annealed carbon co-implanted SiGe material) can be employed to reduce wafer warpages and thus to reduce litho-mis-alignment residuals in the back-end-of-line flow.

In various embodiments, the methods shown in FIG. 1 and/or FIG. 2 can be used in various semiconductor fabrication processes where doped SiGe material can be used and followed by an UHT anneal. For example, FIG. 5 depicts an exemplary transistor fabrication process 500 using SiGe material for source/drain (S/D) regions in a transistor device using methods described in FIGS. 1-2 in accordance with the present teachings.

Figure 5:
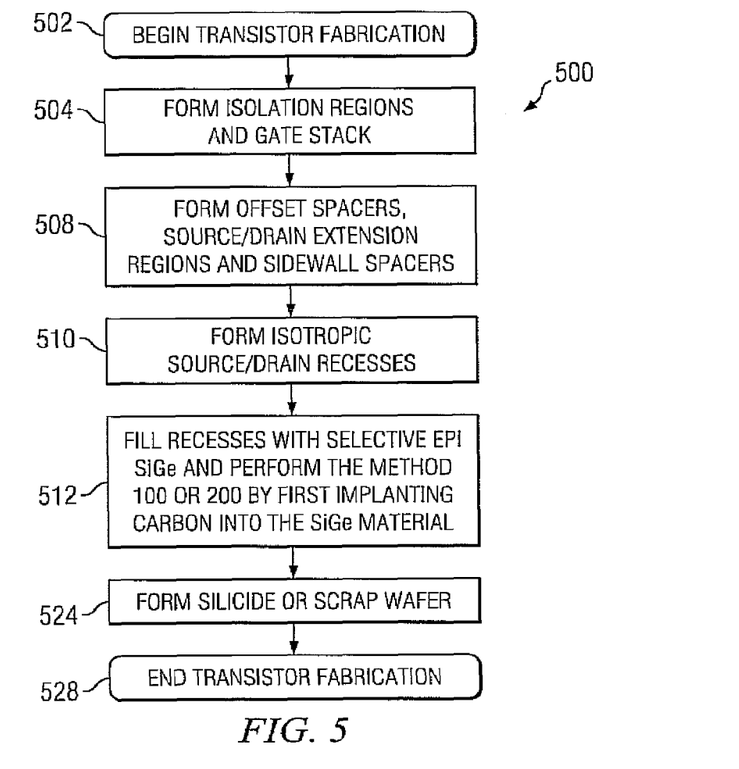
FIG. 5 depicts an exemplary transistor fabrication process using SiGe material for source/drain regions in accordance with the present teachings.

Beginning at 502 in FIG. 5, transistor fabrication can be initiated. At 504, the transistor well/isolation regions can be formed. PMOS and NMOS active regions can thereafter be defined, wherein PMOS regions can include an N-well in which p-type source/drain regions can later be formed, and NMOS regions can include a P-well in which n-type source/drain regions can later be formed. The isolation regions can include, for example, shallow trench isolation (STI), field oxide regions (FOX), or other isolation structures known to one of ordinary skill in the art that serves to define various active areas, and to electrically isolate the various active areas laterally from one another.

Still at 504, a gate stack can be formed on the active areas of the transistor device. For example, a gate oxide layer can be formed on active areas defined by the various formed isolation regions followed by a formation of a conductive gate electrode over the gate oxide layer. The gate oxide can be, for example, a thin, thermally grown silicon dioxide layer. In various embodiments, other type gate dielectrics, e.g., high-k dielectrics, can be formed and be contemplated by the present teachings. The gate electrode can be, for example, a polysilicon layer deposited via chemical vapor deposition (CVD) and patterned via etching to form gate electrodes in both NMOS and PMOS regions, respectively.

At 508, offset spacers, source/drain extension regions and sidewall spacers can then be formed on lateral edges of the conductive gate electrodes. For example, a thin offset layer (e.g., an oxide or nitride layer) can be formed generally conformally over the patterned gate and then etched using an anisotropic dry etch to remove offset layer material on top of the gate and in the source/drain regions, leaving a thin offset spacer material on lateral edges of the gate stack. The offset spacer can be employed to space the source/drain extension regions away from the channel region under the gate, for example, by a distance of about 5 nm to about 20 nm.

Following the formation of the offset spacer on lateral edges of the gate stack, the source/drain extension regions that extend between the gate structure and the isolation regions can be implanted and/or annealed. For example, lightly doped, medium doped or heavily doped extension region implantations can be performed in the NMOS and PMOS regions separately using appropriate masking. In some cases, an anneal process, such as a thermal anneal, can be employed to activate the extension region dopants, which can cause the extension regions to diffuse laterally and slightly underneath the offset spacer toward active channels of respective NMOS or PMOS regions.

Following the formation of the source/drain extension regions, the source/drain sidewall spacers can be formed overlying the offset spacers on the lateral edges of the gate stack. The sidewall spacers can include an insulating material such as an oxide, a nitride or a combination of such layers. The sidewall spacers can be formed by depositing a layer of such spacer material(s) over the device in a generally conformal manner, followed by an anisotropic etch, and thereby removing such spacer material from the top of the gate structure and from active areas, leaving a region on the lateral edges of the gate structure that overlays the offset spacers. The sidewall spacers can substantially be thicker than the offset spacers and thereby resulting in the subsequently formed source/drain regions to be offset from lateral edges of the gate structure, for example, at least about 60 nm.

At 510, recesses (also referred to herein as "source/drain recesses") can then be formed using an isotropic etch in the exposed active areas of the semiconductor body that correspond to the source/drain regions. The isotropic etch can cause a removal of silicon in the silicon body in all directions at approximately the same rate.

In an exemplary embodiment, the isotropic etch can be performed by a wet etch that is highly selective with respect to the dielectric materials (e.g., oxide and nitride) used for sidewall spacers and STI fills. For example, the wet etchant can include a strong base such as tetramethylammonium hydroxide (TMAH), choline, ethylenediamine, hydrazine or other quartenary ammonium hydroxide, or other suitable wet etchants. In another exemplary embodiment, isotropic dry etch having a substantially high selectivity to oxide or nitride can be employed. For example, a recess can be formed using, a dry etching process, such as the chemistry employed to etch STI trenches in the semiconductor body when forming isolation regions. In various embodiments, prior to the recess formation, a short oxide strip (approximately 10 angstrom) with diluted HF (<1%) can be performed in order to remove native oxide that can potentially block the etch of the semiconductor body.

The isotropic nature of the etch can provide the recess with an extension under the source/drain sidewall spacer toward the channel region. Therefore, the recess formed at 510 can extend laterally under the sidewall spacers toward the channel region underneath the gate. When the recess is subsequently filled with a stress inducing material, for example, a compressive SiGe material for a PMOS device, the SiGe material can be physically close to the PMOS channel region and thus the compress stress can be more efficiently transferred to the channel region for an improved hole mobility.

Returning to FIG. 5, at 512, the source/drain recesses can then be filled by a selective epi deposition process with SiGe material for PMOS devices. In an exemplary embodiment, the SiGe material can be formed in the source/drain recesses by LPCVD processes using dichlorosilane, germane and hydrogen chloride as the source gases. The SiGe source/drain regions can be P-type doped in-situ during the selective epi deposition. Alternatively, the SiGe source/drain regions can be P-type doped after such deposition if the source/drain regions are not doped during the selective epi deposition process.

The doped SiGe source/drain regions can then be processed by the disclosed methods 100 and/or 200 as described in FIGS. 1-2. For example, the doped SiGe source/drain regions can be co-implanted with carbon and resulting in SiGeC source/drain regions. Further, as similarly described in FIG. 2, the processed device or wafer with SiGeC source/drain regions can be examined by a curvature measurement followed by an UHT anneal process at a temperature ranging from about 1235° C. to about 1300° C. having a dwell time of about 1.0 ms or shorter. Following the UHT anneal, the processed wafer can be reexamined by a second curvature measurement to determine a wafer warpage from the curvature difference performed before and after the UHT anneal and thus to determine a potential litho-mis-alignment residual.

In this manner, at 524, a determination of whether the transistor fabrication process 500 should be continued (also see 224 in FIG. 2) or ceased (also see 226 in FIG. 2) can be made. For example, to continue the transistor fabrication, a silicidation process can be performed, wherein a metal layer can be formed over the processed device followed by a thermal process, where the metal and silicon interfaces react to form a silicide (on top of the gate and in the source/drain regions). By stripping away the unreacted metal, back end processing such as interlayer dielectric and metallization layers can then be formed. The fabrication process 500 concludes at 528.

FIGS. 6A-6E depict an exemplary transistor device 600 at various stages of fabrication shown in FIG. 5 in accordance with the present teachings. It should be readily apparent to one of ordinary skill in the art that the transistor device 600 depicted in FIGS. 6A-6E represents a generalized schematic illustration and that other layers/regions/materials can be added or existing layers/regions/materials can be removed or modified.

Figure 6A:
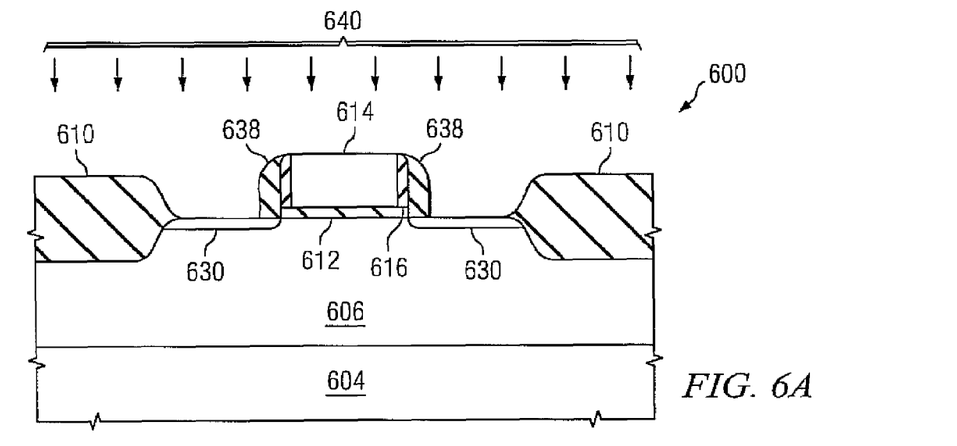
FIGS. 6A-6E depict an exemplary transistor device at various stages of fabrication according to FIG. 5 in accordance with the present teachings.

As shown in FIG. 6A, the device 600 includes a semiconductor substrate 604, a doped well 606, isolation regions 610, a gate dielectric layer 612, a gate electrode 614, offset spacers 616, source/drain extension regions 630, and sidewall spacers 638. The gate electrode 614 can be stacked on the gate dielectric layer 612, which can be formed on the doped well 606 in the semiconductor substrate 604. The offset spacers 616 and the sidewall spacers 638 can be formed along the sidewalls of the stacked gate electrode 614 and on the semiconductor substrate 604. The source/drain extension regions 630 can be formed adjacent to the gate electrode 614 and in the doped well 606.

The doped well 606 in the semiconductor substrate 604 can be, for example, an N-type doped well for a PMOS device. The isolation regions 610, e.g., a STI or FOX, can be formed to define active areas for fabrication of the transistor device 600.

The gate dielectric layer 612 can be formed on the N-well 606. The gate dielectric layer 612 can include a layer of silicon oxide, silicon oxynitride, or any suitable dielectric layer material. The MOS transistor gate electrode 614 can be formed on the gate dielectric layer 612 and can include, for example, a doped polycrystalline silicon, a metal, or any suitable conductor material.

Following the formation of the gate electrode 614, the offset spacers 616 can be formed residing on lateral edges (i.e., sidewalls) of the gate stack. The source/drain extension regions 630 can then be formed extending between the gate stack and the isolation regions 610 by implanting desired, for example, p-type dopants, into the exemplary N-well 606. In various embodiments, an optional subsequent thermal anneal can be performed following the implantation.

Sidewall spacers 638 can then be formed by depositing an insulative material over the device and performing an anisotropic etch 640 to remove such material from a top of the gate electrode 614 and away from the active areas.

Figure 6B:
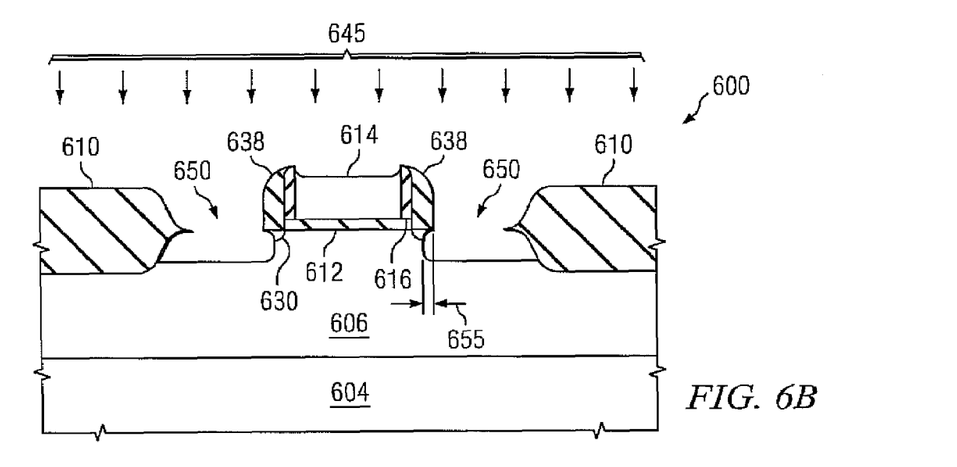

In FIG. 6B, recesses 650 can be formed in the active areas after the source/drain sidewall spacers 638 has been formed, wherein such recesses can be formed via an isotropic etch process 645. As discussed supra, the isotropic etch 645 can cause the each recess to extend a distance 655 under the sidewall spacer 638, such that the material (e.g., SiGe) that is subsequently filled in the recesses 650 can be closer to the channel region.

Figure 6C:
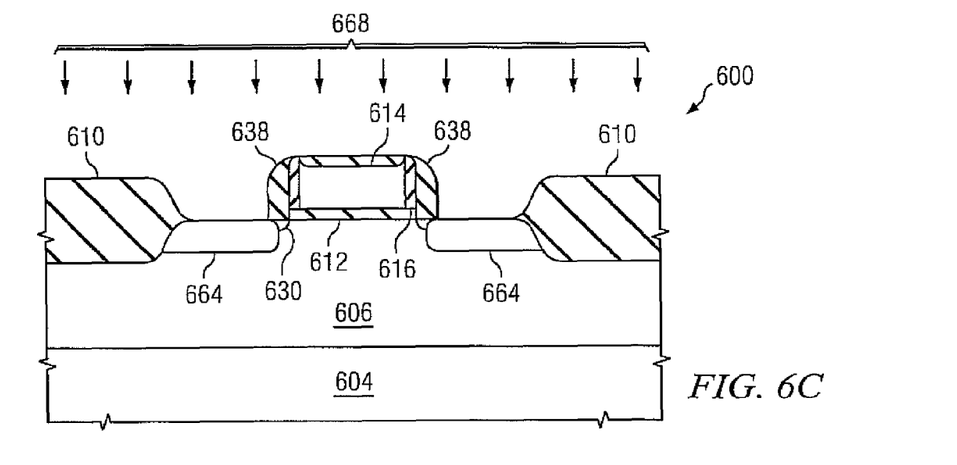

In FIG. 6C, the SiGe material 664 can then be formed in the recesses 650 via a selective epitaxial deposition process 668. The SiGe material 664 formed in the recesses 650 can be used as source/drain regions for the exemplary PMOS device. In addition, an n-type dopant can be added in the selective epi deposition process in order to dope the source/drain regions in-situ. Alternatively, after the selective epi deposition, the source/drain regions can be doped by a source/drain implantation.

Figure 6D:
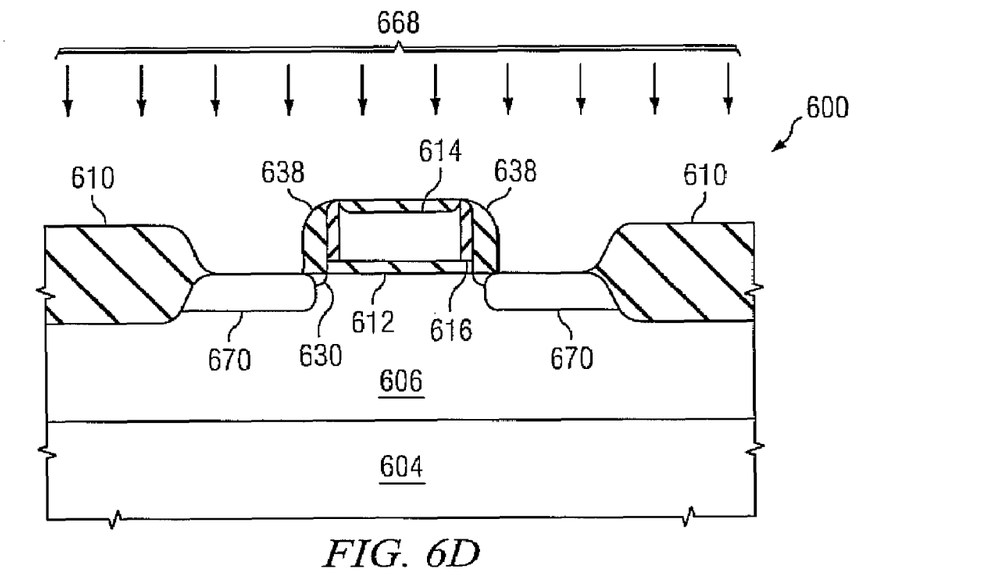

In FIG. 6D, SiGeC source/drain regions 670 can be formed by first implanting carbon into the doped SiGe source/drain regions 664 shown in FIG. 6C to provide an increased melting point for a subsequent UHT anneal. The carbon-implanted SiGe source/drain regions can be examined by a first curvature measurement (not shown), followed by an UHT anneal (not shown) forming the SiGeC source/drain regions 670 and a second curvature measurement (not shown), as similarly described in FIGS. 1-2 and FIG. 5. Wafer warpage can then be calculated based on the difference between the curvature measurements performed pre- and post- the UHT anneal. A correlated litho-mis-alignment can thus be determined by the wafer warpage to determine the fabrication quality and the fabrication potential of the processed device/wafer.

Figure 6E:
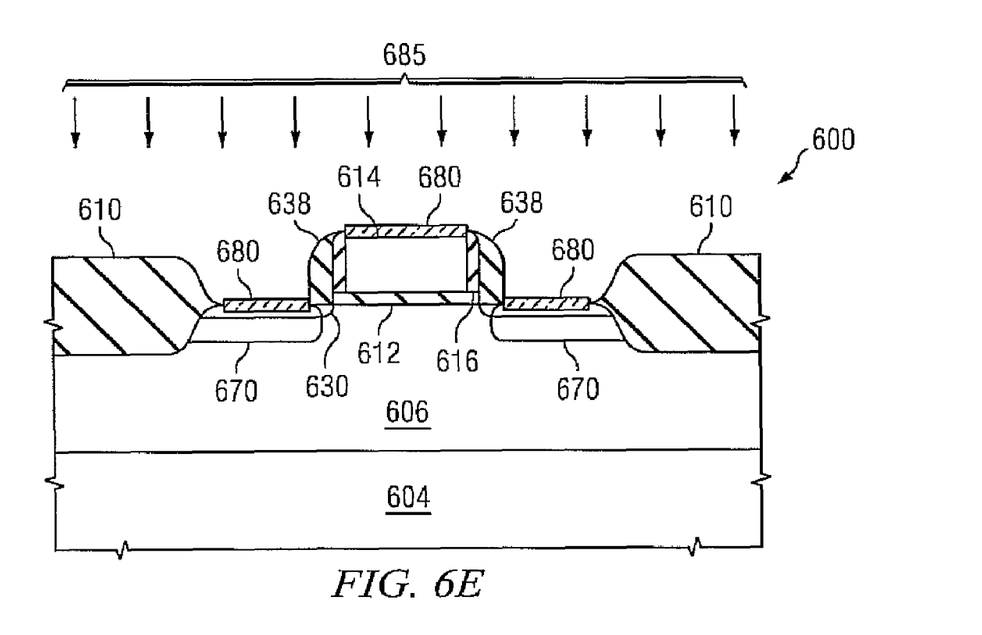

In FIG. 6E, when the correlated litho-mis-alignment is within the manufacturing specification, the device 600 can be further processed by, for example, formation of silicide regions 680 via a silicidation process 685 followed by back end processing as known to one of ordinary skill in the art.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for processing a semiconductor material comprising:
    providing a semiconductor structure comprising a SiGe material;
    implanting carbon into the SiGe material;
    performing a first curvature inspection of the semiconductor structure;
    following the first curvature inspection, annealing the carbon implanted SiGe material at a temperature ranging from about 1235° C. to about 1300° C.;
    performing a second curvature inspection of the semiconductor structure following the anneal; and
    determining a litho-misalignment of the semiconductor structure based on a difference between the first curvature inspection and the second curvature inspection.

2. The method of claim 1, wherein the SiGe material is used for one or more regions of source and drain regions, and source and drain extension regions of a transistor device.

3. The method of claim 1, wherein the SiGe material is used for a base region of a bipolar transistor.

4. The method of claim 1, wherein the SiGe material is a P-doped SiGe material.

5. The method of claim 1, wherein the carbon is implanted into the SiGe material at an energy of about 4 to about 15 keV.

6. The method of claim 1, wherein the carbon is implanted into the SiGe material at a dose of about $5 \times 10^{14}$ atoms/cm2 to about $2 \times 10^{15}$ atoms/cm$^2$.

7. The method of claim 1, wherein the carbon implanted SiGe material comprises a carbon fraction ranging from about 0.5% to about 1.0%.

8. The method of claim 1, wherein the carbon implantation increases the melting point of the SiGe material by about 50° C. or more.

9. The method of claim 1, further comprising continuing the processing of the semiconductor material if the litho-misalignment is within a manufacturing specification.

10. The method of claim 1, further comprising ceasing the processing of the semiconductor material if the litho-mis-alignment is out of a manufacturing specification.

11. A method for controlling a semiconductor process comprising:
    providing a semiconductor structure comprising a SiGe material;
    implanting carbon into the SiGe material to provide an increased melting point;
    performing a first curvature inspection of the semiconductor structure comprising the carbon implanted SiGe material;
    following the first curvature inspection, annealing the carbon implanted SiGe material at an ultra-high temperature of about 1235° C. to about 1300° C. for about 1.0 millisecond or shorter;
    performing a second curvature inspection of the annealed semiconductor structure; and
    determining a litho-misalignment of the semiconductor structure from a difference between the first curvature inspection and the second curvature inspection.

12. The method of claim 11, wherein the annealed carbon implanted SiGe material comprises a carbon fraction ranging from about 0.5% to about 1.0%.

13. The method of claim 11, further comprising continuing the semiconductor process if the litho-misalignment is within a manufacturing specification.

14. The method of claim 11, further comprising ceasing the semiconductor process if the litho-misalignment is out of a manufacturing specification.

15. The method of claim 11, wherein the litho-misalignment is linearly correlated with a wafer warpage determined by the difference between the first curvature inspection and the second curvature inspection.

16. A method for forming a transistor device comprising:
    forming a gate stack over a semiconductor body, and a sidewall spacer along each lateral sidewall of the gate stack;
    forming source and drain recesses by an isotropic etch in the semiconductor body, wherein the source/drain recesses reside in source/drain regions of the semiconductor body, and extend laterally toward the channel region underneath the gate stack;
    epitaxially growing a SiGe material in the source/drain recesses, wherein the SiGe material is p-doped;

implanting carbon into the doped SiGe material to provide an increased melting point;

performing a first curvature inspection of the transistor device prior to the ultra-high temperature anneal;

following the first curvature inspection, annealing the carbon implanted SiGe material at an ultra-high temperature ranging from about 1235° C. to about 1300° C. for about 1.0 ms or less:

performing a second curvature inspection following the ultra-high temperature anneal; and determining a litho-misalignment of the transistor device based on a difference between the first curvature inspection and the second curvature inspection.

17. The method of claim 16, wherein the annealed carbon implanted SiGe material comprises a carbon fraction ranging from about 0.5% to about 1.0%.

18. The method of claim 16, wherein the carbon is implanted into the SiGe material at an energy of about 4 keV to about 15 keV and at a dose of $5 \times 10^{14}$ atoms/cm$^2$ to about $2 \times 10^{15}$ atoms/cm$^2$.

19. The method of claim 16, further comprising:
forming an offset spacer on each lateral sidewall of the gate stack, forming source/drain extension regions in the semiconductor body aligned to each offset spacer, and forming a sidewall spacer over each offset spacer followed by the formation of the source/drain recesses via the isotropic etch.

20. The method of claim 16, further comprising siliciding the transistor device if the litho-misalignment is within a manufacturing specification.

21. The method of claim 16, further comprising ceasing the fabrication process of the transistor device if the litho-misalignment is out of a manufacturing specification.

22. The method of claim 16, wherein the litho-misalignment is linearly correlated with a wafer warpage determined by the difference between the first curvature inspection and the second curvature inspection.

* * * * *